US009767969B2

(12) United States Patent
Boe et al.

(10) Patent No.: US 9,767,969 B2
(45) Date of Patent: Sep. 19, 2017

(54) SUBSEA POWER SWITCHING DEVICE AND METHODS OF OPERATING THE SAME

(75) Inventors: Ove Boe, Tanem (NO); Espen Haugan, Trondheim (NO); Asle Einar Skjellnes, Ranheim (NO); Torbjoern Stroemsvik, Trondheim (NO)

(73) Assignee: SIEMENS AKTIENGESELLSCHAFT, Munich (DE)

(*) Notice: Subject to any disclaimer, the term of this patent is extended or adjusted under 35 U.S.C. 154(b) by 524 days.

(21) Appl. No.: 13/825,851

(22) PCT Filed: Sep. 1, 2011

(86) PCT No.: PCT/EP2011/065133
§ 371 (c)(1),
(2), (4) Date: Mar. 25, 2013

(87) PCT Pub. No.: WO2012/038237
PCT Pub. Date: Mar. 29, 2012

(65) Prior Publication Data
US 2013/0300491 A1    Nov. 14, 2013

(30) Foreign Application Priority Data
Sep. 24, 2010   (EP) ..................... 10179526

(51) Int. Cl.
*H01H 9/54*   (2006.01)
*G01R 27/18*  (2006.01)
*H01H 9/16*   (2006.01)

(52) U.S. Cl.
CPC ............ *H01H 9/548* (2013.01); *G01R 27/18* (2013.01); *H01H 9/167* (2013.01)

(58) Field of Classification Search
CPC ......... H01H 9/548; H01H 9/167; G01R 27/18
See application file for complete search history.

(56) References Cited

U.S. PATENT DOCUMENTS 5,406,128 A * 4/1995 Arinobu .......................... 307/64
5,864,458 A * 1/1999 Duffy .................. C11D 11/0082
361/10

(Continued)

FOREIGN PATENT DOCUMENTS

DE    4108049 A1 *  9/1992  .............. H02H 3/08
EP    0418919 A2     3/1991  .............. H01H 9/54

(Continued)

OTHER PUBLICATIONS

International Search Report and International Preliminary Report on Patentability, Application No. PCT/EP2011/065133, 10 pages, Nov. 23, 2011.

*Primary Examiner* — Thienvu Tran
*Assistant Examiner* — Pinping Sun
(74) *Attorney, Agent, or Firm* — Slayden Grubert Beard PLLC

(57) ABSTRACT

It is described a switching device comprising a semiconductor switching unit; a contactor electrically coupled in series with the semiconductor switching unit; and a controller being configured for activating an electrically isolating state of the switching device and/or activating an electrically conducting state of the switching device based on a command signal or based on a comparison of a measured value and predetermined activation condition.

7 Claims, 4 Drawing Sheets

(56) References Cited

U.S. PATENT DOCUMENTS

| | | | |
|---|---|---|---|
| 6,275,366 B1 * | 8/2001 | Gelbien | H02H 7/262 361/115 |
| 7,218,494 B2 * | 5/2007 | Kudo | G01R 33/02 361/93.1 |
| 7,639,461 B2 * | 12/2009 | DiSalvo et al. | 361/42 |
| 7,965,065 B2 * | 6/2011 | Hirota | G11C 17/18 323/233 |
| 7,969,246 B1 * | 6/2011 | An et al. | 330/311 |
| 8,536,731 B2 * | 9/2013 | Biester et al. | 307/12 |
| 2009/0097172 A1 * | 4/2009 | Bremicker | H01H 9/542 361/8 |
| 2012/0113696 A1 * | 5/2012 | Voigtlaender | 363/71 |

FOREIGN PATENT DOCUMENTS

| | | | | |
|---|---|---|---|---|
| EP | 2192416 A1 * | 6/2010 | | G01R 31/02 |
| FR | 2419650 A1 | 10/1979 | | B63C 11/00 |
| GB | 1600095 A | 10/1981 | | B63C 11/00 |
| GB | 2181599 A | 4/1987 | | H02H 3/02 |
| JP | 4289623 A | 10/1992 | | H01H 33/66 |
| WO | 2012/038237 A1 | 3/2012 | | H01H 9/54 |

* cited by examiner

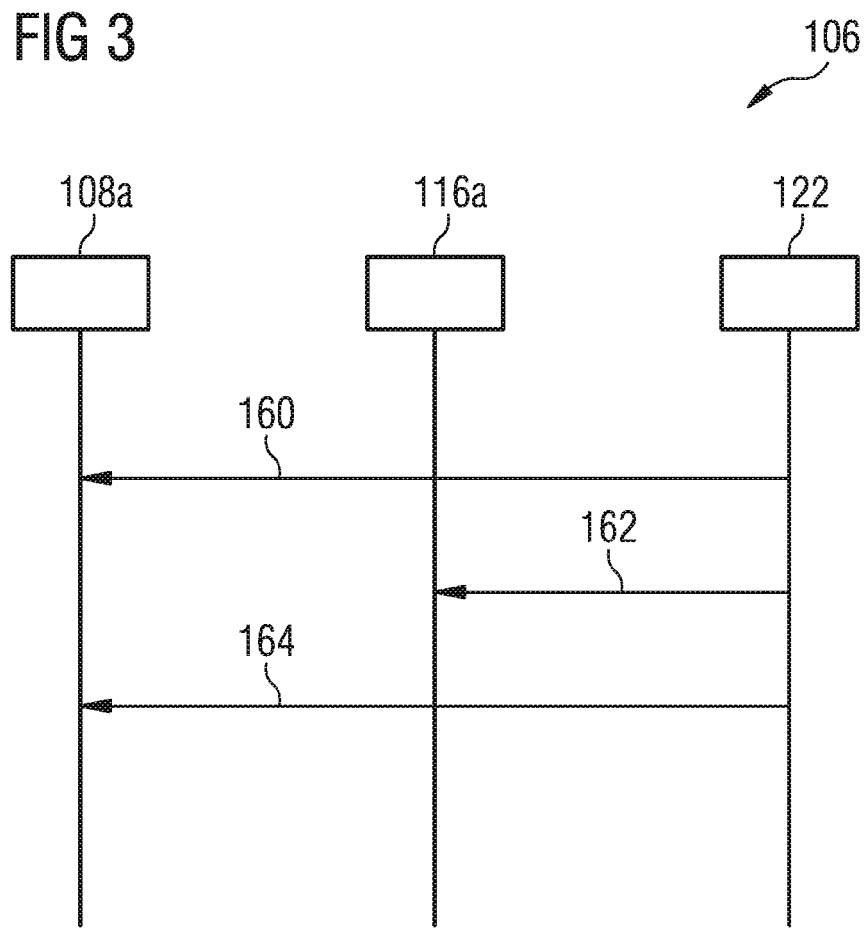

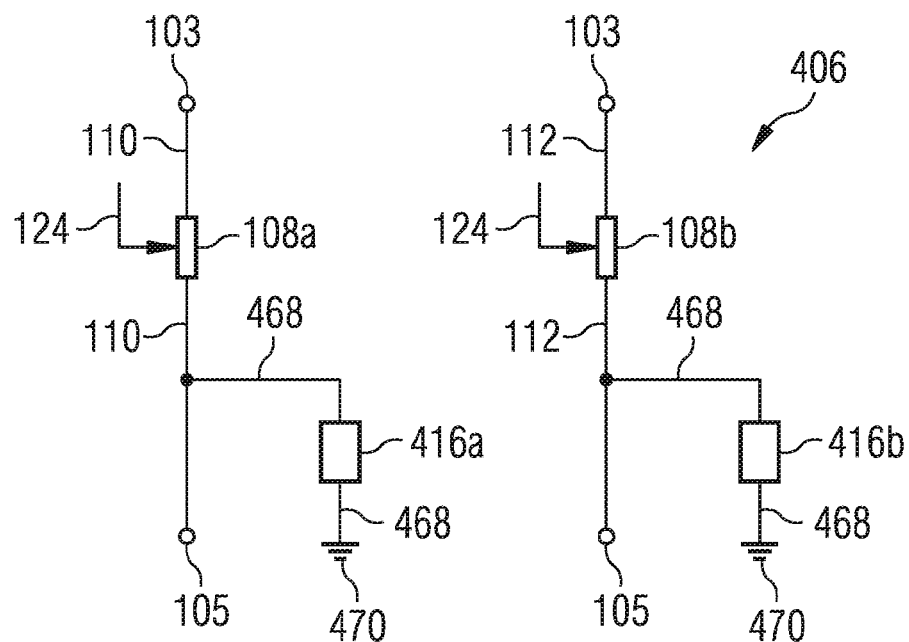
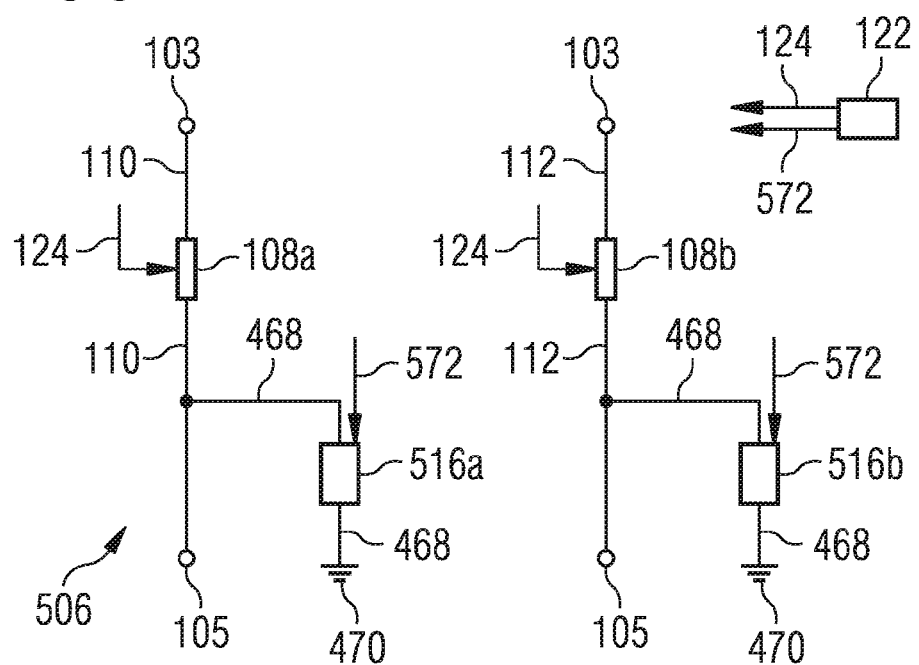

SUBSEA POWER SWITCHING DEVICE AND METHODS OF OPERATING THE SAME

CROSS-REFERENCE TO RELATED APPLICATIONS

This application is a U.S. National Stage Application of International Application No. PCT/EP2011/065133 filed Sep. 1, 2011, which designates the United States of America, and claims priority to EP Patent Application No. 10179526.8 filed Sep. 24, 2010 The contents of which are hereby incorporated by reference in their entirety.

TECHNICAL FIELD

The present disclosure relates to the field of subsea power switching devices for disconnecting electrical lines and in particular to a switching device operable under subsea conditions.

BACKGROUND

Circuit breakers are known in the art. However, in order to operate a conventional circuit breaker remotely without a manual operation, the circuit breaker needs a motor connected to it.

However, electrical motors usually require maintenance in certain operation intervals.

In view of the above-described situation, there exists a need for an improved technique that enables to provide a switching device for disconnecting an electrical line while substantially avoiding or at least reducing the above-identified problem.

SUMMARY

In one embodiment, a subsea power switching device comprises: a first terminal; a second terminal; a semiconductor switching unit driveable into a blocking state electrically isolating the first terminal and the second terminal; and a decoupling unit electrically coupled in series with the semiconductor switching unit for further electrically decoupling the second terminal from the first terminal if the semiconductor switching unit is in the blocking state to thereby provide an electrically isolating state of the switching device.

In a further embodiment, the decoupling unit comprising a contactor electrically coupled in series with the semiconductor switching unit; the switching device further comprising a controller being configured for activating the electrically isolating state of the switching device by (i) providing a first control signal to the semiconductor switching unit, the first control signal being operative to drive the semiconductor switching unit into the blocking state; and (ii) subsequently providing a second control signal to the contactor, the second control signal being operative to drive the contactor into an galvanically isolating state while the semiconductor switching unit is still in the blocking state.

In a further embodiment, the semiconductor switching unit comprises two semiconductor switches electrically coupled anti-parallel with regard to each other.

In a further embodiment, the switching device further comprises an earth fault detection device for detecting an earth fault at a conductor and providing in response hereto a earth fault signal.

In a further embodiment, the switching device further comprises a load current sensor for providing a current signal indicative of a load current flowing through the switching device.

In a further embodiment, the switching device further comprises a state unit for providing a state information signal indicative of whether the switching device is in the electrically isolating state or in the electrically conducting state.

In a further embodiment, the controller being configured for activating an electrically conducting state of the switching device by (iii) providing a third control signal to the semiconductor switching unit, the third control signal being operative to drive the semiconductor switching unit (108a, 108b, 108c) into the blocking state; (iv) subsequently providing a fourth control signal to the contactor, the fourth control signal being operative to drive the contactor into an electrically conducting state while the semiconductor switching unit is still in the blocking state; and (v) subsequently providing a fifth control signal to the semiconductor switching unit, the fifth control signal being operative to drive the semiconductor switching unit (108a, 108b, 108c) into an electrically conducting state.

In a further embodiment, the decoupling unit comprises a resistor coupling second terminal to ground.

In a further embodiment, the decoupling unit comprises a grounding unit for selectively coupling the second terminal to ground in the electrically isolating state of the switching device.

In a further embodiment, the grounding unit comprises a further switching unit; and the switching device further comprising a controller for controlling the further switching unit so as to couple the second terminal in the electrically isolating state of the switching device to ground.

In another embodiment, a power supply includes a switching device as disclosed above. In a further embodiment, the power supply is a subsea power supply.

In another embodiment, a method of activating an electrically isolating state of a subsea power switching device having a first terminal and a second terminal and a semiconductor switching unit electrically coupled between the first terminal and the second terminal is provided, the method comprising: driving the semiconductor switching unit into a blocking state; and further electrically decoupling the first terminal from the second terminal.

In a further embodiment of the method, the switching device further includes a contactor electrically coupled in series with the semiconductor switching unit, and wherein further electrically decoupling the first terminal from the second terminal comprises after driving the semiconductor switching unit into a blocking state, subsequently driving the contactor into an galvanically isolating state while maintaining the semiconductor switching unit in the blocking state.

In another embodiment, a computer program is stored in non-transitory computer-readable media and executable by a data processor to perform any or all of the method steps disclosed above.

BRIEF DESCRIPTION OF THE DRAWINGS

Example embodiments will be explained in more detail below with reference to figures, in which:

FIG. 3 shows exemplary signaling between the controller 122 and a semiconductor switching unit 108a, and between the controller 122 and a contactor 116a during activation of an galvanically isolating state of the switching device of FIG. 1.

FIG. 4 shows a further switching device in accordance with embodiments of the herein disclosed subject matter.

FIG. 5 shows a still further switching device in accordance with embodiments of the herein disclosed subject matter.

DETAILED DESCRIPTION

Figure 1:
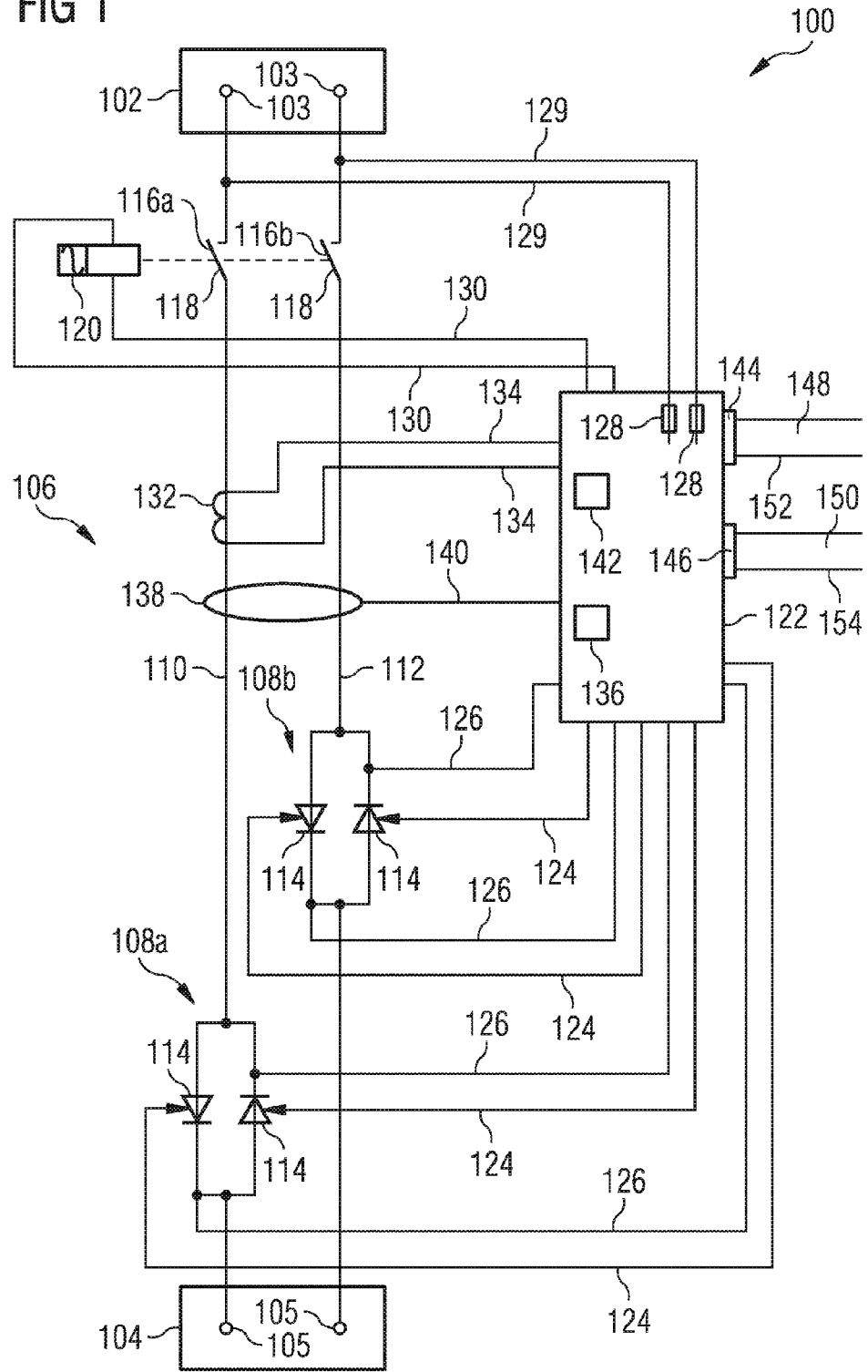
FIG. 1 shows a one-phase power supply in accordance with embodiments of the herein disclosed subject matter.

This need may be met by the subject-matter according to the independent claims. Advantageous embodiments of the herein disclosed subject-matter are described by the dependent claims.

According to a first aspect of the herein disclosed subject matter, there is provided a subsea power switching device (hereinafter referred to as switching device) comprising a first terminal; a second terminal; a semiconductor switching unit driveable into a blocking state electrically isolating the first terminal and the second terminal; a decoupling unit electrically coupled in series with the semiconductor switching unit for further electrically decoupling the second terminal from the first terminal if the semiconductor switching unit is in the blocking state to thereby provide an electrically isolating state of the switching device. According to an embodiment, the decoupling unit comprises a contactor. For example, according to an embodiment of the first aspect, there is provided a switching device comprising a semiconductor switching unit, a contactor electrically coupled in series with the semiconductor switching unit, and a controller being configured for activating an electrically isolating state of the switching device by (i) providing a first control signal to the semiconductor switching unit, the first control signal being operative to drive the semiconductor switching unit into a blocking state and (ii) subsequently providing a second control signal to the contactor, the second control signal being operative to drive the contactor into a galvanically isolating state while the semiconductor switching unit is still in the blocking state.

This embodiment is based on the idea that a stable and reliably working switching device can be provided by providing galvanical isolation with a contactor which is switched only in a currentless state, wherein the currentless state is provided by a semiconductor switching unit electrically coupled in series with the contactor.

Generally herein, a "signal for driving" may be any signal that performs the specified action. Such a "signal" may also be the absence of a previously applied signal. For example, in an embodiment the contactor is biased into an open state, e.g. by a resilient element. In such a case, a closing signal is continuously applied to the contactor as long as it is desired to maintain the contactor in the closed state. The closing signal may be e.g. a continuously voltage applied to the contactor. In the case of such a contactor, the signal for driving the contactor into the open state would be a zero voltage or a voltage that is below a threshold above which the contactor is driven into the closed state. In other words, in such an embodiment any interruption of the continuously applied closing signal (voltage) is a signal for driving the contactor into the open state.

According to embodiments of the herein disclosed subject-matter, the switching device is particularly suited for subsea environment, where devices should work stable and reliable without errors over a long time.

According to an embodiment, the semiconductor switching unit comprises a single semiconductor switch. According to other embodiments, the semiconductor switching unit comprises two or more semiconductor switches. For example, for an alternating current, in an embodiment the semiconductor switching unit comprises two semiconductor switches coupled antiparallel with regard to each. According to an embodiment, a semiconductor switch is for example a thyristor or a transistor. Instead of antiparallel thyristors the semiconductor switching unit may comprise a Triac. According to other embodiments, other semiconductor elements may be used as the semiconductor switches.

According to an embodiment, the contactor comprises or consists of an electrically controlled mechanical switch used for a switching power circuit. According to a further embodiment, the contactor is drivable into a galvanically isolating state. According to an embodiment, the contactor is configured so as to be incapable, e.g. due to its dimensioning, of interrupting a short circuit current in the particular application without being damaged. In other embodiments, it is undesirable to interrupt a short circuit current, e.g. if the contactor is operated in an electrically non-conducting fluid such as oil.

According to a further embodiment, the switching device comprises an earth fault detection device for detecting an earth fault at a conductor and providing in response hereto an earth fault signal. For example, in an embodiment, the earth fault detection device is configured for detecting an earth fault in the switching device itself. According to another embodiment, the earth fault detection device is configured for detecting an earth fault in an electrical line electrically coupled to the switching device. In such an embodiment, the earth fault detection device is capable of detecting an earth fault in the electrical line or an earth fault in a device, e.g. a consumer, electrically coupled to the electrical line.

Generally herein, according to an embodiment, a "signal" is a signal that is generated only upon a certain event. For example, the earth fault signal may be generated upon the event of an earth fault. In other embodiments, a "signal" is a signal that is continuously provided and the content of which is indicative of a certain event. For example, in such an embodiment, the earth fault signal is a continuously provided signal (e.g. voltage signal) the content of which (e.g. the voltage level of which) indicates whether or not an earth fault has occurred.

According to an embodiment, the switching device further comprises a load current sensor for providing a current signal indicative of a load current flowing through the switching device, wherein the controller is configured for activating the electrically isolating state depending on the current signal. For example, the controller may be configured for activating the isolating state if the current signal matches an activation condition. The activation condition may be received from an external controller or from a storage of the switching device. For example, according to an embodiment, the switching device comprises a control input for receiving a control signal indicative of the activation condition, wherein the controller is configured for activating the isolating state if the current signal matches the activation condition.

According to a further embodiment, the switching device comprises a storage for storing the activation condition. In such an embodiment, the controller may be configured for comparing the current signal to the activation condition and for activating the isolating state if the current signal matches the stored activation condition.

In an embodiment, the activation condition is a certain current threshold. In such an embodiment, the switching device may act as a circuit breaker. In a further embodiment, the activation condition may be a threshold for a mean current determined over a predetermined time period. According to other embodiments, other activation conditions are possible, depending on the particular application in which the switching device is used.

According to a further embodiment, the switching device further comprises a state unit for providing a state information signal indicative of whether the switching device is in the electrically isolating state or in the electrically conducting state. For example, in an embodiment, the switching device may comprise a signal output for providing the state information signal to an external control unit. According to a further embodiment, the state information signal may be used by the controller for selecting an appropriate control strategy upon a switching request requesting a change between the electrically isolating state and the electrically conducting state of the switching device.

According to an embodiment, the state unit is provided by a storage, e.g. a storage element which is set by the controller depending on whether the controller has activated the electrically isolating state or the electrically conducting state.

According to a further embodiment, the state unit is implemented in the contactor, e.g. in the form of an auxiliary contact which provides the state information signal.

According to a further embodiment, the controller is further configured for activating the electrically conducting state by (iii) providing a third control signal to the semiconductor switching unit, the third control signal being operative to drive the semiconductor switching unit into the blocking state, (iv) subsequently providing a fourth control signal to the contactor, the fourth control signal being operative to drive the contactor into a galvanically conducting state while the semiconductor switching unit is still in the blocking state, (v) subsequently providing a fifth control signal to the semiconductor switching unit, the fifth control signal being operative to drive the semiconductor switching unit into an electrically conducting state. In this way, the switching device is capable of turning on a consumer even if the contactor is not capable of switching on a starting current level which may be a multiple of the rated current of the consumer.

According to an embodiment, the contactor or at least the mechanical switch is submerged into a fluid. Due to the fluid, the speed of operation of the switch or contacts of the contactor will be slowed thus making the contactor unable to interrupt short circuit or overload currents. In an embodiment, the purpose of the contactor is to provide galvanic insulation, e.g. to the outgoing feeder, when it needs to be disconnected. The actual switching operation is handled by the semiconductor switching unit. In cases where an galvanic insulation is not required, the contactor may be omitted. Alternatively an extra set of semiconductor switching units or grounding resistors may be used to lock the potential of the outgoing phaselines to ground once they are disconnected by the semiconductor switching unit acting as a load breaker.

Accordingly, in an embodiment the decoupling unit comprises a resistor electrically coupling the second terminal to ground. If multiple conductors (and correspondingly multiple first and second terminals) are provided, a resistor may be provided for each conductor. For example, if the resistance of the resistor is respectively adapted, a good compromise is provided between current leakage to ground via the resistor in the electrically conducting state of the switching device and sufficient further decoupling of the second terminals from the first terminals in the electrically isolating state of the switching device. For example, in an embodiment where the voltage is about 690 V (e.g. of an auxiliary power supply), the resistance of the resistor may be in the kilo-Ohm range (e.g. 0.5 kOhm to 5 kOhm).

According to a further embodiment, the decoupling unit comprises a grounding unit for selectively coupling the second terminal to ground in the electrically isolating state of the switching device. For example, in one embodiment, the grounding unit comprises a further switching unit. In an embodiment, the switching device further comprises a controller for controlling the further switching unit (hereinafter also referred to as second controller) so as to couple the second terminal, in the electrically isolating state of the switching device, to ground.

According to an embodiment, the second controller for controlling the further switching unit and the above described controller being configured for activating an electrically isolating state of the switching device are realized by the same, single controller. For example, in accordance with an embodiment, such a single controller may be a respectively programmed programmable device, e.g. processor device.

For example, in an embodiment, the second controller is configured for coupling the second terminal to ground in response to a blocking indication signal indicating that the semiconductor switching unit is in the blocking state. Such a blocking indication signal may be provided by the semiconductor switching unit itself. Further, e.g. in case of a single controller, the controller may be configured for driving the semiconductor switching unit into the blocking state and subsequently driving the further switching unit into an electrically conducting state, thereby electrically coupling the second terminal to ground.

It should be noted that generally herein the term "electrically coupling" a first entity to a second entity does not exclude any third entity between the first entity and the second entity as long as the electrical coupling is maintained. Further term "electrically coupling" a first entity to a second entity explicitly includes an embodiment wherein the first entity to the second entity are electrically connected. Further term "electrically coupling" a first entity to a second entity explicitly includes an embodiment wherein the first entity to the second entity are galvanically connected.

According to a second aspect of the herein disclosed subject-matter, a switching device is provided, the switching device comprising a semiconductor switching unit, a contactor electrically coupled in series with the semiconductor switching unit, and a controller being configured for activating an electrically conducting state of the switching device by (i) providing a first control signal to the semiconductor switching unit, the first control signal being operative to drive the semiconductor switch into a blocking state, (ii) subsequently providing a second control signal to the contactor, the second control signal being operative to drive the contactor into a galvanically conducting state while the semiconductor switching unit is still in the blocking state, (iii) subsequently providing a third control signal to the semiconductor switching unit, the third control signal being operative to drive the semiconductor switching unit into an electrically conducting state.

In accordance with embodiments of the second aspect, the switching device or entities thereof (e.g. the semiconductor switching unit, the contactor or the controller) are configured in accordance with embodiments described with regard to the first aspect.

It should be noted that the numbering of the signals is provided just for identification purposes in conjunction with the respective aspect and embodiments described which might be replaced by any identification reference with changing the subject matter. For example, having regard to activating the electrically conducting state, feature (iii) as described with regard to the first aspect corresponds to feature (i) of the second aspect and so forth.

Summarizing some embodiments the first and the second aspect, there is provided a switching device which is capable of assuming a first, galvanically isolating state and a second, electrically (galvanically) conducting state. According to an embodiment, the transition from the galvanically isolating state to the electrically conducting state is performed in accordance with embodiments disclosed herein whereas the reverse transition is performed in any suitable way. Further, according to a further embodiment, the transition from the electrically conducting state to the galvanically isolating state is performed in accordance with embodiments disclosed herein whereas the reverse transition is performed in any suitable way. According to a still further embodiment, the transition from the galvanically isolating state to the electrically conducting state as well as the reverse transition from the electrically conducting state to the galvanically isolating state is performed in accordance with embodiments disclosed herein.

According to a third aspect of the herein disclosed subject-matter, a power supply is provided, the power supply having a switching device according to the first aspect or an embodiment thereof or a switching device according to the second aspect or an embodiment thereof.

According to a further embodiment of the third aspect, the power supply is a subsea power supply. For example, in an embodiment the switching device is coupled between an auxiliary power supply of a subsea switch gear and a consumer, e.g. a controller, of a variable speed drive (VSD) for subsea applications (subsea VSD). Exemplary power requirements are in a voltage range between 200 volts and 600 volts (200 V-600 V), and a current range between a 1 ampere and 100 amperes (1 A-100 A), just to give an example. According to an embodiment, the subsea VSD is intended for supplying pumps and compressors. Power requirements for such a subsea VSD may be for example up to 6 MVA. However, a subsea VSD is only one example of a consumer, even if the switching device as described herein is especially suitable for this purpose. In accordance with a more general embodiment, a switching device as described herein is provided for each electrical conductor connecting a power source and a consumer in order to galvanically connect or disconnect the power source and the consumer via the electrical conductor. In accordance with a further embodiment, in case of a multiphase electrical power, a switching device as described herein is used for each phase of the electrical power in order to connect or disconnect respective phase. According to further embodiments, some entities of the switching device as described herein are used for all or a subset of the conductors of an electrical link (e.g. for all phases in the case of a multiphase power). For example a single earth fault detection device may be provided for detecting an earth fault in any of the conductors of a multi-conductor electrical link, e.g. in the phases of the multiphase electrical power.

According to an embodiment, the subsea VSD is based on a cell-type converter where each cell has a low voltage between the phases. According to a further embodiment, the switching device according to an aspect or embodiment described herein is electrically coupled between a pre-charge supply for a subsea VSD and the subsea VSD. According to a further embodiment, the switching device according to an aspect or embodiment described herein is electrically coupled between an auxiliary power supply for a subsea VSD and the subsea VSD.

According to a fourth aspect of the herein disclosed subject-matter, a method of activating an electrically isolating state of a switching device having a first terminal and a second terminal and a semiconductor switching unit electrically coupled between the first terminal and the second terminal is provided, the method comprising: driving the semiconductor switching unit into a blocking state; further electrically decoupling the first terminal from the second terminal.

According to an embodiment, the switching device further comprises a contactor electrically coupled in series with the semiconductor switching unit, the method comprising (i) driving the semiconductor switching unit into a blocking state and (ii) subsequently driving the contactor into a galvanically isolating state while maintaining the semiconductor switching unit in the blocking state, thereby further electrically decoupling the first terminal from the second terminal.

According to a further embodiment, the method comprises further electrically decoupling the first terminal from the second terminal by electrically grounding the semiconductor switching unit.

It should be understood that once the contactor is in the galvanically isolating state, the state of the semiconductor switching unit is not relevant for the state of the whole switching device.

According to a fifth aspect of the herein disclosed subject-matter, a method of activating an electrically conducting state of a switching device is provided, a semiconductor switching unit and a contactor electrically coupled in series with the semiconductor switching unit is provided, the method comprising (i) driving the semiconductor switching unit into a blocking state, (ii) subsequently driving the contactor into an electrically conducting state while maintaining the semiconductor switching unit in the blocking state, (iii) subsequently driving the semiconductor switching unit into an electrically conducting state.

According to a sixth aspect of the herein disclosed subject-matter, a computer program is provided, the computer program when being executed by a data processor is adapted for controlling the method as set forth in the fourth aspect or an embodiment thereof.

According to a seventh aspect of the herein disclosed subject-matter, a computer program is provided, the computer program, when being executed by a data processor, being adapted for controlling the method as set forth in the fifth aspect or an embodiment thereof.

As used herein, reference to a computer program is intended to be equivalent to a reference to a program element and/or a computer readable medium containing instructions for controlling a computer system to coordinate the performance of the above described method.

The computer program may be implemented as computer readable instruction code by use of any suitable programming language, such as, for example, JAVA, C++, and may be stored on a computer-readable medium (removable disk, volatile or non-volatile memory, embedded memory/processor, etc.). The instruction code is operable to program a computer or any other programmable device to carry out the intended functions. The computer program may be available from a network, such as the World Wide Web, from which it may be downloaded.

Suitable entities of the herein disclosed subject matter, e.g. the controller, may be realized by means of a computer program respectively software. However, suitable entities of the herein disclosed subject matter may also be realized by means of one or more specific electronic circuits respectively hardware. Furthermore, suitable entities may also be realized in a hybrid form, i.e. in a combination of software modules and hardware modules.

In the above there have been described and in the following there will be described exemplary embodiments of the subject-matter disclosed herein with reference to a switching device and a method of activating an electrically isolating state of a contactor and a method of activating an electrically conducting state of a switching device. It has to be pointed out that of course any combination of features relating to different aspects of the herein disclosed subject-matter is also possible. In particular, some embodiments have been described with reference to apparatus type claims whereas other embodiments have been described with reference to method type claims. Further, some embodiments have been described with reference to activation of an electrically isolating state of a switching device whereas other embodiments have been described with regard to activation of an electrically conducting state of a switching device. However, a person skilled in the art will gather from the above and from the following description that, unless otherwise notified, in addition to any combination of features belonging to one aspect also any combination of features relating to different aspects or embodiments, for example even between features of apparatus type embodiments and features of method type embodiments, as well as features relating to activation of an electrically isolating state and features of activation of an electrically conducting state of a switching device is considered to be disclosed with this application.

FIG. 1 shows a one-phase power supply 100 for a consumer 104, e.g. for a controller of a subsea variable speed drive. The power supply 100 comprises a power source 102 and a switching device 106 which is electrically coupled between the power source 102 and the consumer 104. In particular, the switching device is coupled to the power source 102 via first terminals 103 and is further coupled to the consumer 104 via second terminals 105. The switching device 106 comprises a semiconductor switching unit 108a, 108b for each conductor 110, 112 extending between the power source 102 and the consumer 104. According to an exemplary embodiment shown in FIG. 1, there are two conductors 110, 112 extending between the power source 102 and the consumer 104, capable of carrying, for example, a one-phase alternating current (AC) power. According to other embodiments, other numbers of conductors and hence a respective number of semiconductor switching units 108a, 108b may be provided.

Each semiconductor switching unit 108a, 108b comprises two semiconductor switches 114 which are electrically coupled antiparallel with regard to each other.

In accordance with embodiments of the herein disclosed subject-matter, the switching device 106 further comprises a contactor 116a, 116b for each conductor 110, 112. The contactor is a decoupling unit according to an embodiment of the herein disclosed subject matter. The contactor 116a, 116b comprises, according to an embodiment, a mechanical switch 118 and an actor 120 for operating the mechanical switch 118. In an embodiment, the actor 120 comprises a solenoid. In accordance with a further embodiment, two or more contactors may include a common element. For example, according to an embodiment each contactor 116a, 116b comprises a mechanical switch 118 and two or more of the mechanical switches 118 are operated by a common actor 120, as shown in FIG. 1.

The switching device 106 further comprises a controller 122 which, according to an embodiment, is configured for activating an electrically isolating state of the switching device 106. In accordance with an embodiment, the electrically isolated state of the switching device 106 is activated by providing a first control signal 124 to the semiconductor switching unit 108a, 108b, e.g. by providing the first control signal 124 to each semiconductor switch 114 of each semiconductor switching unit 108a, 108b. For having a well-defined potential over the gate/drain and the gate/source of the semiconductor switches 114, a source and/or a drain of each semiconductor switch is electrically connected, indicated at 126 in FIG. 1, to the control unit 122. The first control signal 124 is operative to drive the semiconductor switching unit 108a, 108b into a blocking state.

According to an embodiment, the control unit 122 is supplied with power from the power source 102. In an embodiment, the control unit 122 is electrically coupled to the power source 102 via fuses 128 and electrical lines 129. In an embodiment, the fuses 128 include a thin wire of silver or a copper track in an oil environment. However, the fuse 128 may also be replaced with a high ohmic resistance or a positive temperature coefficient (PTC) resistor that ensures a low and safe short circuit current in case of a short circuit in the control unit 122.

In accordance with an embodiment of the herein disclosed subject-matter, after providing the first control signal 124 to the semiconductor switching unit 108a, 108b, subsequently a second control signal 130 is provided to the contactor and in particular to the actor 120 thereof. The second control signal 130 drives the contactor 116a, 116b into a galvanically isolating state, thereby galvanically isolating the power source 102 and the consumer, e.g. the VSD 104. During driving the contactor 116a, 116b into the galvanically isolating state, the semiconductor switching unit 108a, 108b is maintained in the blocking state. It should be understood that the blocking state of the semiconductor switching unit 108a, 108b may also be referred to as an electrically insulating state. However, the semiconductor switching unit itself does not allow a galvanical isolation of the source and drain of the semiconductor switches 114 and hence the semiconductor switching unit itself does not allow a galvanical isolation of the power source 102 and the VSD 104. However, such a galvanical isolation of the power source and the VSD 104 is provided by the contactor 116a, 116b.

In accordance with an embodiment, the switching device 106 comprises a load current sensor 132 for providing a current signal 134 indicative of a load current flowing through the switching device 106. For example, in an embodiment the load current sensor 132 is a load current transformer having windings in the vicinity of the conductor 110 for sensing the current in the conductor 110.

In accordance with an embodiment, the controller 122 is configured for activating the isolating state of the switching device depending on the current signal 134. For example, in an embodiment the controller 122 is configured for activating the isolating state if the current signal 134 matches an activation condition stored in a storage 136 of the controller 122.

In accordance with a further embodiment, the switching device 106 comprises an earth fault detection device 138 for detecting an earth fault at a conductor 110, 112. To this end, the earth fault detection device 138 may be coupled to the switching device 106 for sensing the earth fault. In accordance with a further embodiment, the earth fault detection device is configured for providing an earth fault signal 140 in response to detecting an earth fault at one of the conductors 110, 112 or at a device electrically coupled to the conductors 110, 112. In accordance with an embodiment, the controller 122 is configured for activating the electrically isolating state of the switching device 106 if the earth fault signal 140 indicates that an earth fault has occurred. In accordance with an embodiment, the earth fault signal 140 is continuous signal indicative of a sum of the currents flowing through the conductors 110, 112. In such an embodiment, the earth fault detection device 138 may be a sensing transformer providing an output signal indicative of the sum of the currents flowing through the conductors 110, 112.

In accordance with a further embodiment, the switching device 106 comprises a state unit 142 for providing a state information signal (not shown in FIG. 1) indicative of, whether the switching device 106 is in the electrically isolating state or in the electrically conducting state. For example, in accordance with an embodiment, the state unit 142 is included in the controller 122 and may be implemented, in an embodiment, by a storage storing the last status of the state of the switching device 106.

In accordance with an embodiment, the switching device 106 comprises a control input 144, 146 for receiving a control signal 148, 150 indicative of an activation condition. In accordance with an embodiment, the activation condition received by control signals 148, 150 is stored in the storage 136 for providing the possibility to operate the switching device 106 with the stored parameters without external communications. In accordance with an embodiment, the control signals 148, 150 are provided via a communication bus 152, 154, for example a CAN bus. In accordance with an embodiment shown in FIG. 1, the communication bus 152, 154 is provided redundantly. The communication bus 152, 154 may be used also for other purposes, e.g. indication of output states, possible software updates, etc.

Figure 2:
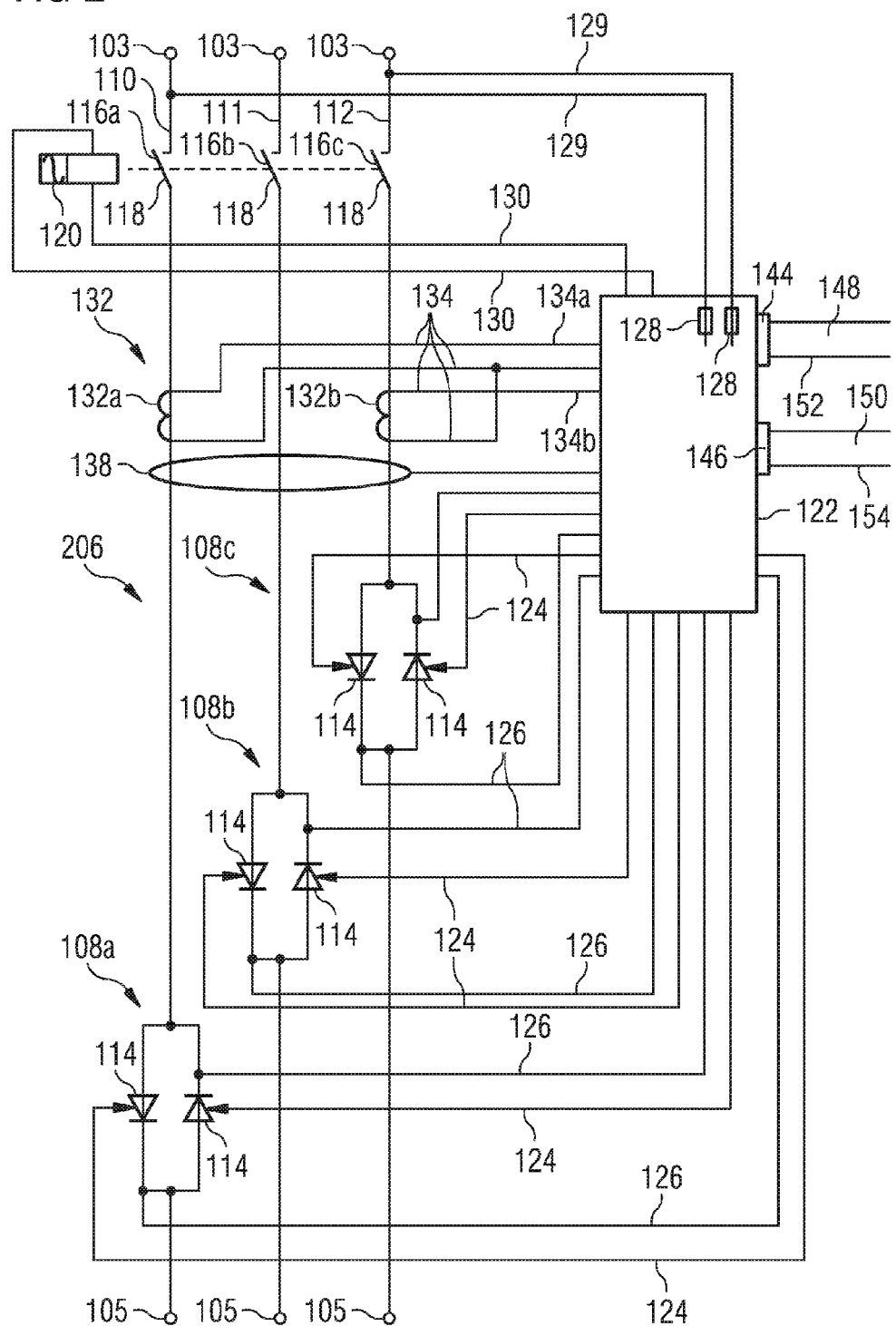
FIG. 2 shows a three-phase power supply in accordance with embodiments of the herein disclosed subject matter.

FIG. 2 shows a further switching device 206 in accordance with embodiments of the herein disclosed subject-matter. Similar or identical elements compared to FIG. 1 have been assigned with the same reference signs and the description thereof is not repeated here. Rather the differences with regard to FIG. 1 are described.

In contrast to FIG. 1, the switching device 206 in FIG. 2 is adapted for electrically isolating first terminals 103 from second terminals 105 or for electrically connecting the first terminals 103 and the second terminals 105, wherein according to an embodiment shown in FIG. 2 three first terminals 103 and three second terminals 105 are provided corresponding to a three-phase power to be transmitted over three conductors 110, 111, 112. Accordingly, the switching device 206 comprises three semiconductor switching units 108a, 108b, 108c each with respective thyristors 114 coupled antiparallel with respect to each other. As described with regard to FIG. 1, the thyristors 114 may be implemented by thyristors. In accordance with a further embodiment, the two antiparallel thyristors may be replaced by a single triac. The earth fault detection device 138 of the switching device 206 embraces all three conductors 110, 111, 112 to ensure that any earth fault on one of these conductors 110, 111, 112 or the circuits coupled thereto (not shown) is detected. Accordingly, also the load current sensor 132 comprises two load current sensor components 132a, 132b for sensing the load current on the respective conductor 110, 112 and providing in response hereto a respective current signal 134 including current signal components 134a, 134b from the two load current sensor components 132a, 132b. As shown in FIG. 2, for three conductors 110, 111, 112 corresponding to three phases of AC power, two load current sensor components 132a, 132b are sufficient to determine the load current for each phase since the current for the remaining phase on the conductor 111 can be calculated from the load currents on the first conductor 110 and the third conductor 112 and the overall load current which can be measured e.g. by the sensing transformer 138. However, according to a further embodiment, a load current sensor component is provided for each of the conductors 110, 111, 112.

Having regard to the contactors 116a, 116b, 116c, similar to the embodiment shown in FIG. 1, in the switching device 206 of FIG. 2 a mechanical switch 118 is provided for each conductor 110, 111, 112, where all mechanical switches 118 are operated by a common actor 120.

The series combination of semiconductor switching units 108a, 108b, 108c with corresponding contactors 116a, 116b, 116c provides the advantage that the semiconductor switching units can be effectively totally disconnected from the power source 102. Therefore, even if the semiconductor switching units 108a, 108b, 108c have a high ohmic value when not turned on, earth faults or other faults can be avoided by galvanically disconnecting the semiconductor switching units 108a, 108b, 108c from the power source 102. An example herefor are antiparallel thyristors and corresponding snubber circuits which both have a high ohmic value when the thyristor is not turned on.

As is apparent from FIG. 1 and FIG. 2, according to an embodiment, each of the first signals 124 provided to the individual semiconductor switches 114 is separately provided to the control unit.

While activation of the galvanically isolating state, e.g. the transition from the electrically conducting state to the galvanically isolating state has been described with reference to FIG. 1 and FIG. 2, in the following the reverse transition, or, more general, the activation of the electrically conducting state will be addressed.

FIG. 3 shows exemplary signaling between the controller 122 and a semiconductor switching unit 108a, and between the controller 122 and a contactor 116a during activation of an galvanically isolating state of the switching device 106 of FIG. 1. In accordance with an embodiment, activating an electrically conducting state of the switching device 106 comprises providing a control signal 160 from the controller 122 to the semiconductor switching unit 108a, the control signal 160 being operative to drive the semiconductor switching unit 108a into a blocking state. Subsequently a control signal 162 is provided to the contactor 116a, the control signal 162 being operative to drive the contactor 116a into an electrically conducting state while the semiconductor switching unit 108a is still in the blocking state. Subsequently a control signal 164 is provided by the control unit 122 to the semiconductor switching unit 108a, the control signal 164 being operative to drive the semiconductor switching unit 108a into an electrically conducting state. It should be understood that corresponding signals, e.g. identical signals, are provided to the other switching unit 108b and the other contactor 116b of the switching device. Hence, with the semiconductor switching units 108a, 108b being in the electrically conducting state while also the contactors 116a, 116b are in the electrically conducing state, the switching device 106 as such is in an electrically conducting state, electrically connecting the first terminals 103 and the second terminals 105 (shown in FIG. 1).

FIG. 4 shows a switching device 400 in accordance with embodiments of the herein disclosed subject matter. Elements which are similar or identical to elements of the switching device 100 in FIG. 1 are associated with the same reference signs.

In contrast to the switching device 100 shown in FIG. 1, instead of contactors 116a, 116b, the switching device 400 comprises resistors 416a, 416b electrically connecting the second terminals 105 via conductors 468 to ground, indicated at 470 in FIG. 4.

FIG. 5 shows a switching device 500 in accordance with embodiments of the herein disclosed subject matter. Elements which are similar or identical to elements of the switching device 100 in FIG. 1 or of the switching device 400 in FIG. 4 are associated with the same reference signs.

In contrast to the switching device 100 shown in FIG. 1, instead of contactors 116a, 116b, the switching device 400 comprises further switching units 516a, 516b which are configured for selectively electrically connecting the second terminals 105 via conductors 468 to ground 470. In accordance with an embodiment, the controller 122 is configured for providing the control signal 124 which drives the semiconductor switching units 108a, 108b into a blocking state. Further, the controller 122 is configured for subsequently driving, e.g. by driving signals 472, the further switching units 516a, 516b into an electrically conducting state, thereby electrically coupling the second terminals 105 to ground 470.

In accordance with an embodiment, by grounding the second terminals 105 any remaining voltage on the terminals is nullified.

Further embodiments and applications of embodiments are described below:

A Subsea VSD may be based on a cell type converter where each cell has low voltage between phases.

It may be advantageous if both auxiliary power and precharge supply will be provided to the VSD. These circuit supplies will come from the subsea switchgear. The switchgear will have one or more transformers to deliver the necessary auxiliary and precharge circuit supplies.

The switchgear supplies, including a switching device according to the herein disclosed subject matter may have the following possibilities:

Open and close function with or without load.
Parametric programming of short circuit and over load protection level from topside.
Redundant serial bus communication, or one serial bus communication and possibility to operate with the stored parameters without bus communications.
Redundant power auxiliary to each circuit supply.
Position feedback.
Circuit earth fault should be handled.

The design of the circuit protection devices for the auxiliary and precharge devices is particularly based on a combination of contactor and triac (anti parallel thyristors). An own relay function board with a CAN bus interface may be developed for oil filled environment.

In the following exemplary embodiments of circuit breaking and/or circuit switching elements will be discussed further. However the exemplary embodiments and examples of implementation shall not be considered as limiting the scope of the herein disclosed subject matter.

Function of exemplary circuit elements:

For subsea application the circuit elements that also have the functionality as a circuit supply additionally have the combined function as a contactor and a circuit breaker. A contactor is not designed to handle short circuit current, only motor start currents. A circuit breaker (MCCB type) is designed to react very fast and limit the short circuit current. To have the possibility to connect a circuit breaker from off position without a manual operation, the circuit breaker needs a motor connected to it.

Exemplary circuit elements for Subsea Switchgear application:

For subsea switchgear application the elements that are used for the switching is intended to be placed in a pressurized oil environment. Rotating equipment as motors is not advantageous in this relation because of mechanical faults in moving parts, which means that a circuit breaker is not preferred solution for this subsea application. A contactor has a limited function with mechanical moving parts. This function has to be accepted to have total disconnection of an electrical circuit.

One possibility is to combine the function of load switch and short circuit protection in a contactor by reducing the short circuit power from the auxiliary/precharge transformer to a typical motor start current level (typical up to 10×In, wherein In is the rated current of the motor, or, in a more general embodiment, of the electrical consumer). This can be done by individual inductors for each circuit supply or the contactor size may be increased so the short circuit current from the auxiliary/precharge transformer is in the size of 10×In of the contactor In.

Since in embodiments the contactor is not designed for short circuit protection, a static circuit element such as thyristors in anti parallel can be used as short circuit protection and also load/overload switch. This will not pollute the oil environment from arcs when breaking loads with contactor. A solution of thyristors in anti parallel also gives the possibility to break/stop a short circuit current at the first zero crossing of the current, and this gives a maximum time of 10 ms (at 50 Hz) for stopping the short circuit current. For industrial control equipment this is an acceptable loss of control voltage.

In some applications, it is specifically advantageous to combine a contactor in series with a thyristor. However, it should be understood that a thyristor or transistor mentioned herein is only exemplary and that in other embodiments the thyristor or transistor is replaced by any other suitable semiconductor element.

According to embodiments of the herein disclosed subject matter, any suitable entity (e.g. components, units and devices) disclosed herein, e.g. the controller, are at least in part provided in the form of respective computer programs which enable a processor device to provide the functionality of the respective entities as disclosed herein. According to other embodiments, any suitable entity disclosed herein may be provided in hardware. According to other—hybrid—embodiments, some entities may be provided in software while other entities are provided in hardware.

It should be noted that any entity disclosed herein (e.g. components, units and devices) are not limited to a dedicated entity as described in some embodiments. Rather, the herein disclosed subject matter may be implemented in various ways and with various granularity on device level while still providing the desired functionality. Further, it should be noted that according to embodiments a separate entity (e.g. a software module, a hardware module or a hybrid module) may be provided for each of the functions disclosed herein. According to other embodiments, an entity (e.g. a software module, a hardware module or a hybrid module (combined software/hardware module)) is configured for providing two or more functions as disclosed herein.

It should be noted that the term "comprising" does not exclude other elements or steps and the "a" or "an" does not exclude a plurality. Also elements described in association with different embodiments may be combined. It should also be noted that reference signs in the claims should not be construed as limiting the scope of the claims.

In order to recapitulate some the above described embodiments of the herein disclosed subject matter one can state:

It is described a switching device comprising a semiconductor switching unit; a contactor electrically coupled in series with the semiconductor switching unit; and a controller being configured for activating an electrically isolating state of the switching device and/or activating an electrically conducting state of the switching device based on a command signal or based on a comparison of a measured valued and predetermined activation condition. A command signal may be for example the earth fault signal, e.g. a continuously measured signal or a signal only generated upon a certain event, or any other command signal, e.g. a signal received from an external control unit, e.g. via the control input of the switching device. A measured value can be for example the current signal described above or any other measured signal suitable for determining necessity of activation of one of the electrically isolating state or the electrically conducting state of the switching device.

What is claimed is:

1. A subsea power switching device comprising:
   a first terminal for connection to a power source;
   a second terminal for connection to a subsea consumer;
   a semiconductor switching unit driveable into a blocking state electrically insulating the first terminal and the second terminal;
   a decoupling unit comprising at least one contactor electrically coupled in series with the semiconductor switching unit for further electrically decoupling the second terminal from the first terminal when the semiconductor switching unit is in the blocking state to thereby provide a galvanically isolating state of the switching device;
   an earth fault detection device for detecting an earth fault at a conductor and providing in response thereto an earth fault signal;
   a load current sensor for providing a current signal indicative of a load current flowing through the switching device; and
   a controller configured to:
      (a) transition from an electrically conducting state of the switching device to the galvanically isolating state of the switching device by:
         providing a first control signal to switch the semiconductor switching unit into the blocking state; and
         providing a second control signal to drive the at least one contactor into the galvanically isolating state while the semiconductor switching unit remains in the blocking state; and
      (b) transition from the galvanically isolating state of the switching device to the electrically conducting state of the switching device by:
         providing a third control signal to drive the semiconductor switching unit into the blocking state;
         providing a fourth control signal to drive the contactor into an electrically conducting state while the semiconductor switching unit remains in the blocking state; and
         providing a fifth control signal to drive the semiconductor switching unit into an electrical conducting state.

2. Switching device according to claim 1, wherein the semiconductor switching unit comprises two semiconductor switches electrically coupled anti-parallel with regard to each other.

3. Switching device according to claim 1, further comprising a state unit for providing a state information signal indicative of whether the switching device is in the electrically isolating state or in the electrically conducting state.

4. Power supply comprising:
   a switching device comprising:
      first and second power source terminals for connection to a common power source;
      a pair of first and second load terminals for connection to a common load;
      a first conductor extending between only the first power source terminal and first load terminal, and a second conductor extending between only the second power source terminal and second load terminal;
      a first semiconductor switching unit coupled to the first conductor and a second semiconductor switching unit coupled to the second conductor, the first semiconductor switching unit driveable into a blocking state electrically insulating the first power source terminal from the first load terminal and the second semiconductor switching unit driveable into the blocking state electrically insulating the second power source terminal from the second load terminal;
      a decoupling unit comprising at least one contactor electrically coupled in series with the semiconductor switching units for further electrically decoupling the first and second power source terminals from the first and second load terminals when the first and second semiconductor switching units are in the blocking state to thereby provide a galvanically isolating state of the switching device;
      an earth fault detection device for detecting an earth fault at a conductor and providing in response thereto an earth fault signal;
      a load current sensor for providing a current signal indicative of a load current flowing through the switching device; and
      a controller configured to:
         (a) transition from an electrically conducting state of the switching device to the galvanically isolating state of the switching device by:
            providing a first control signal to drive the first and second semiconductor switching units into the blocking state; and
            providing a second control signal to drive the at least one contactor into the galvanically isolating state while the semiconductor switching unit remains in the blocking state; and
         (b) transition from the galvanically isolating state of the switching device to the electrically conducting state of the switching device by:
            providing a third control signal to drive the semiconductor switching unit into the blocking state;
            providing a fourth control signal to drive the contactor into an electrically conducting state while the semiconductor switching unit remains in the blocking state; and providing a fifth control signal to drive the semiconductor switching unit into an electrical conducting state.

5. Power supply according to claim 4, wherein the power supply is a subsea power supply and the load is a subsea load.

6. Method of controlling a subsea power switching device having a first terminal and a second terminal, a semiconductor switching unit electrically coupled between the first terminal and the second terminal, and a switchable contactor electrically coupled in series with the semiconductor switching units and configured to selectively provide the galvanically isolating state of the switching device, the method comprising:
  (a) transitioning from an electrically conducting state of the subsea power switching device to the galvanically isolating state of the switching device by:
    providing a first signal, by a controller, to drive the semiconductor switching unit into a blocking state; and
    providing a second control signal, by the controller, to drive the contactor into the galvanically isolating state while the semiconductor switching unit remains in the blocking state; and
  (b) transitioning from the galvanically isolating state of the subsea power switching device to the electrically conducting state of the switching device by:
    providing a third control signal, by the controller, to drive the semiconductor switching unit into the blocking state;
    providing a fourth control signal, by the controller, to drive the contactor into an electrically conducting state while the semiconductor switching unit remains in the blocking state; and
    providing a fifth control signal, by the controller, to drive the semiconductor switching unit into an electrical conducting state
  monitoring an earth fault detection device for an earth fault at a conductor and providing in response thereto an earth fault signal; and
  monitoring a load current sensor for a current signal indicative of a load current flowing through the switching device.

7. Method according to claim 6, the switching device further having a contactor electrically coupled in series with the semiconductor switching unit, wherein further electrically decoupling the first terminal from the second terminal comprises:
  after driving the semiconductor switching unit into a blocking state, subsequently driving the contactor into a galvanically isolating state while maintaining the semiconductor switching unit in the blocking state.

* * * * *